(12) United States Patent
Ziglioli

(10) Patent No.: US 10,971,375 B2
(45) Date of Patent: Apr. 6, 2021

(54) METHOD OF MANUFACTURING SEMICONDUCTOR DEVICES AND CORRESPONDING SEMICONDUCTOR DEVICE

(71) Applicant: STMICROELECTRONICS S.R.L., Agrate Brianza (IT)

(72) Inventor: Federico Giovanni Ziglioli, Pozzo d'Adda (IT)

(73) Assignee: STMICROELECTRONICS S.R.L., Agrate Brianza (IT)

( * ) Notice: Subject to any disclaimer, the term of this patent is extended or adjusted under 35 U.S.C. 154(b) by 0 days.

(21) Appl. No.: 16/273,991

(22) Filed: Feb. 12, 2019

(65) Prior Publication Data

US 2019/0259629 A1     Aug. 22, 2019

(30) Foreign Application Priority Data

Feb. 21, 2018  (IT) .................. 102018000002903

(51) Int. Cl.
*H01L 21/48*  (2006.01)
*H01L 21/56*  (2006.01)
(Continued)

(52) U.S. Cl.
CPC ........ *H01L 21/4821* (2013.01); *H01L 21/486* (2013.01); *H01L 21/56* (2013.01); (Continued)

(58) Field of Classification Search
CPC ............. H01L 21/4821; H01L 23/3121; H01L 23/482; H01L 23/49541; H01L 23/49827; H01L 23/5226; H01L 23/5389; H01L 24/09; H01L 24/24; H01L 24/82; H01L 24/96

See application file for complete search history.

(56) References Cited

U.S. PATENT DOCUMENTS 8,922,013 B2 * 12/2014 Hwang ............... H01L 23/3171
257/738
9,461,009 B1 * 10/2016 Higgins, III ........ H01L 23/3135
(Continued)

*Primary Examiner* — Allan R Wilson
(74) *Attorney, Agent, or Firm* — Seed Intellectual Property Law Group LLP

(57) ABSTRACT

A method, comprises: providing a laminar support member, having a front surface, arranging on the front surface at least one semiconductor die having a front surface and a back surface, with the back surface thereof towards the front surface of the support member and with the front surface thereof having die pads, arranging at the front surface of the support member sidewise of the at least one semiconductor die a plurality of electrically-conductive bodies, the electrically-conductive bodies arranged at respective recesses in the support member, wherein the electrically-conductive bodies protrude from the plane away from the front surface of the support member, providing a filling of molding material over the laminar support member between the at least one semiconductor die and the electrically-conductive bodies, and providing electrically-conductive lines between selected ones of the die pads of the semiconductor die and selected ones of the plurality of electrically-conductive bodies.

19 Claims, 8 Drawing Sheets

(51) Int. Cl.
*H01L 21/768* (2006.01)
*H01L 23/31* (2006.01)
*H01L 23/522* (2006.01)
*H01L 23/00* (2006.01)
*H01L 23/498* (2006.01)
*H01L 23/538* (2006.01)

(52) U.S. Cl.
CPC .......... *H01L 21/565* (2013.01); *H01L 21/566* (2013.01); *H01L 21/76802* (2013.01); *H01L 21/76877* (2013.01); *H01L 23/3121* (2013.01); *H01L 23/49827* (2013.01); *H01L 23/5226* (2013.01); *H01L 23/5389* (2013.01); *H01L 24/09* (2013.01); *H01L 24/24* (2013.01); *H01L 24/82* (2013.01); *H01L 24/96* (2013.01); *H01L 21/561* (2013.01); *H01L 2224/04105* (2013.01); *H01L 2224/24175* (2013.01); *H01L 2224/82039* (2013.01); *H01L 2924/18162* (2013.01)

(56) References Cited

U.S. PATENT DOCUMENTS

| | | | |
|---|---|---|---|
| 2001/0002330 A1 | 5/2001 | Benenati et al. | |
| 2002/0066954 A1* | 6/2002 | Huang | H01L 21/568 257/707 |
| 2007/0190690 A1 | 8/2007 | Chow et al. | |
| 2008/0308917 A1* | 12/2008 | Pressel | H01L 24/24 257/676 |
| 2009/0085186 A1* | 4/2009 | Meyer | H01L 21/561 257/690 |
| 2009/0102066 A1 | 4/2009 | Lee et al. | |
| 2010/0072599 A1 | 3/2010 | Camacho et al. | |
| 2010/0127386 A1 | 5/2010 | Meyer-Berg | |
| 2013/0105991 A1 | 5/2013 | Gan et al. | |
| 2013/0113098 A1* | 5/2013 | Hwang | H01L 23/3171 257/738 |
| 2014/0015131 A1* | 1/2014 | Meyer | H01L 23/49816 257/738 |
| 2016/0013172 A1* | 1/2016 | Lin | H01L 25/50 438/108 |
| 2017/0345764 A1 | 11/2017 | Chang et al. | |
| 2018/0096975 A1* | 4/2018 | Hua | H01L 23/49827 |
| 2019/0115287 A1* | 4/2019 | Derai | H01L 23/49527 |

* cited by examiner

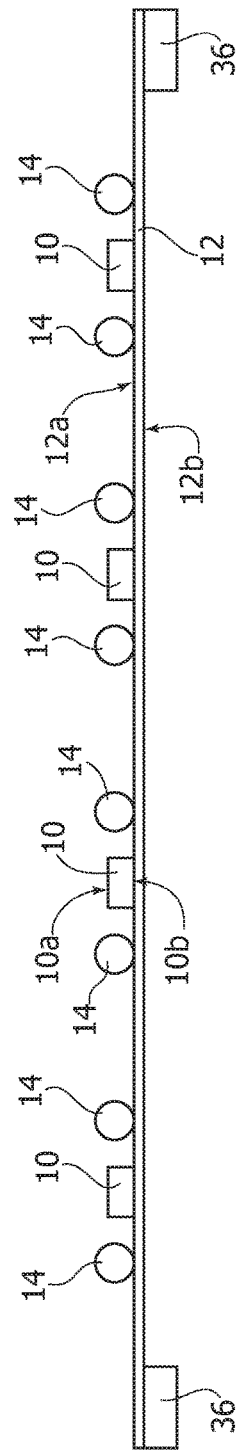
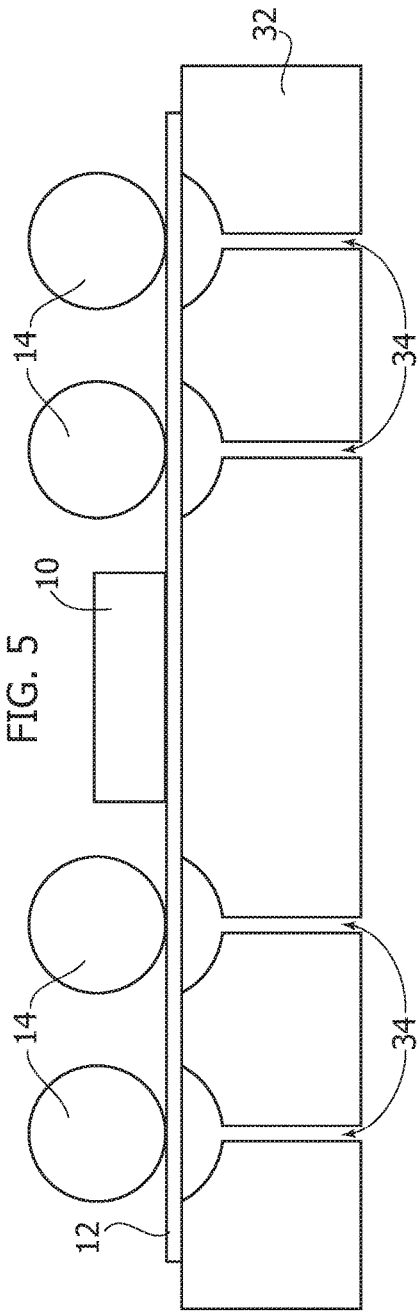
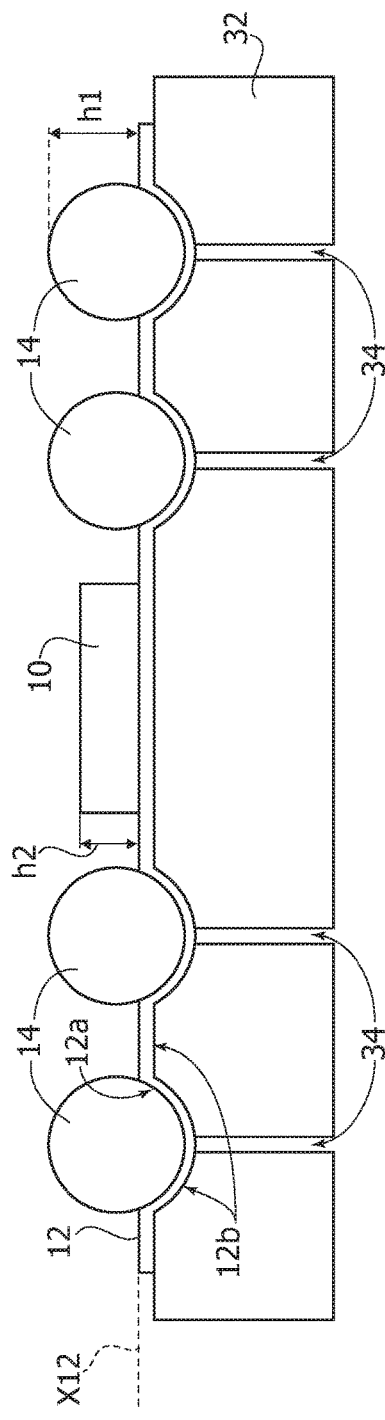

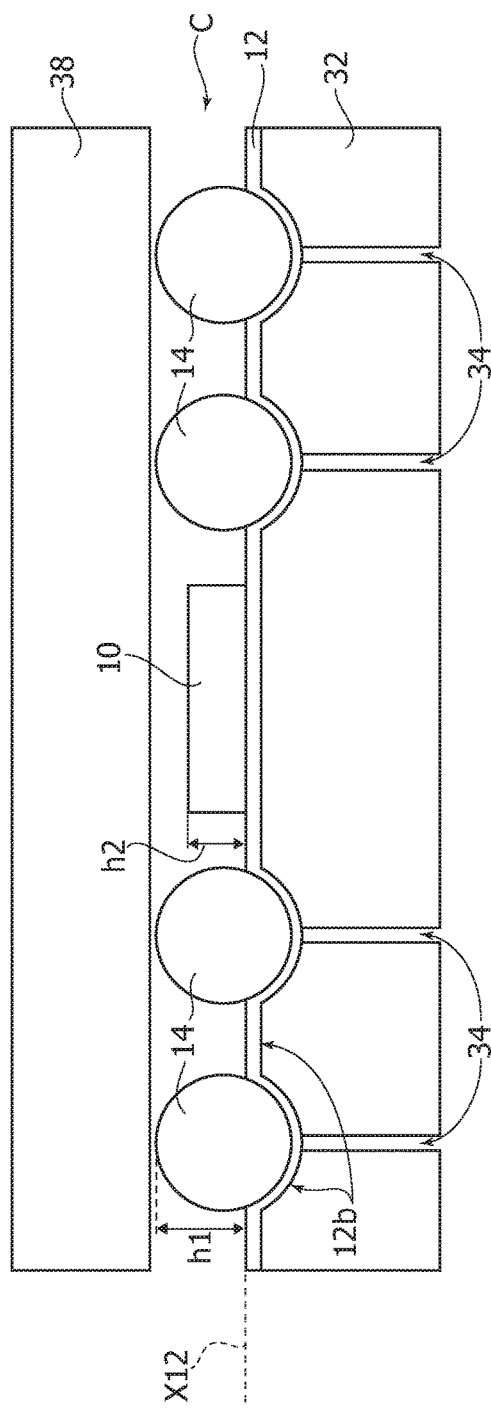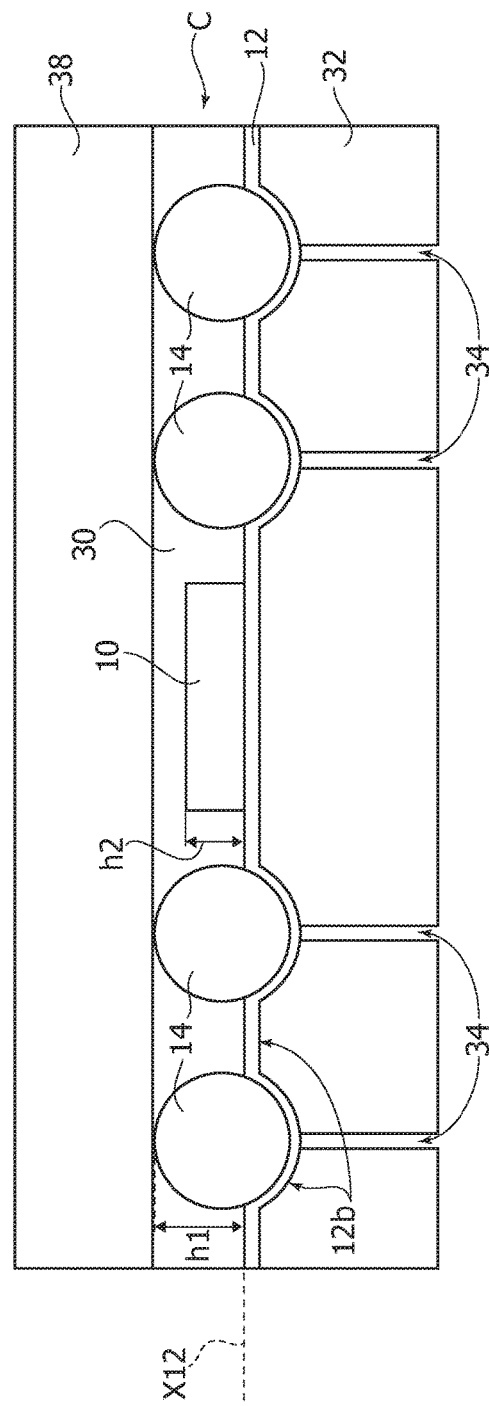

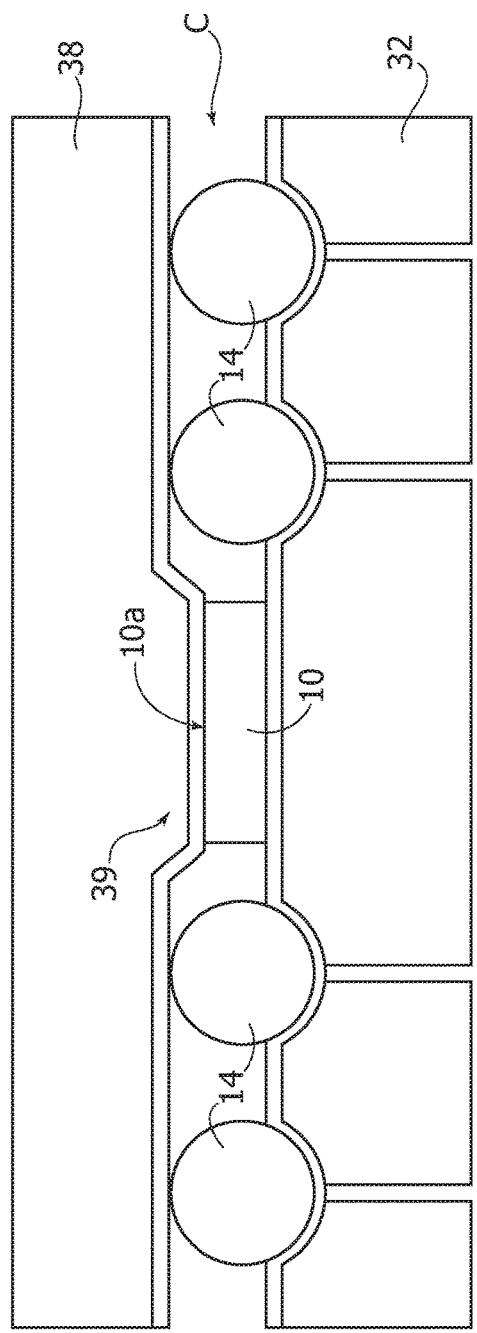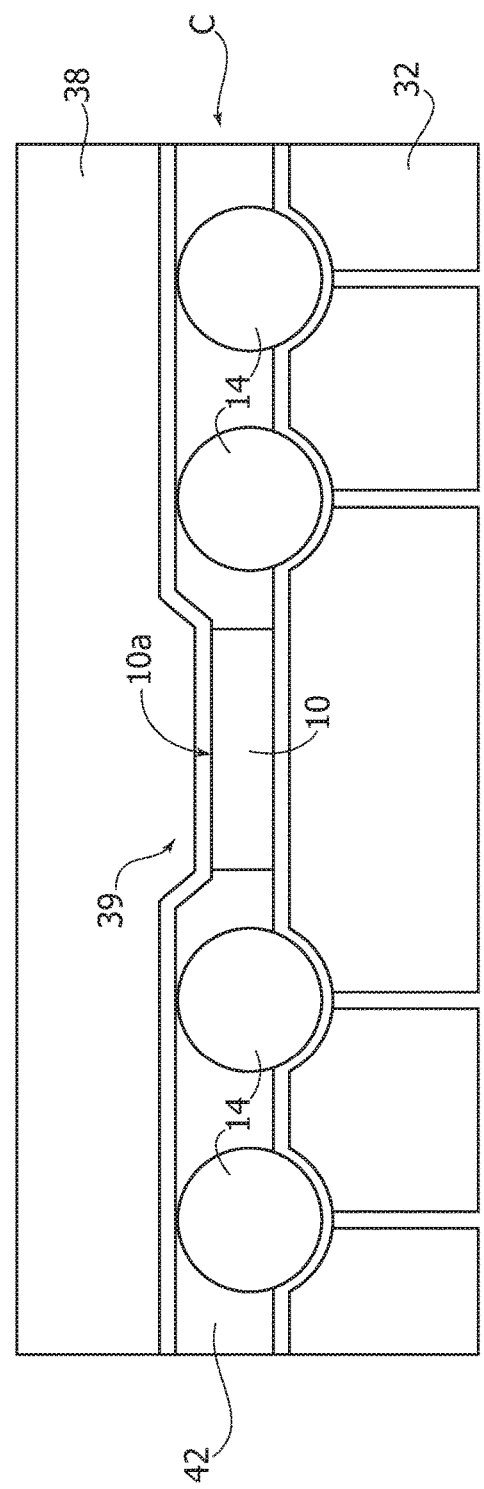

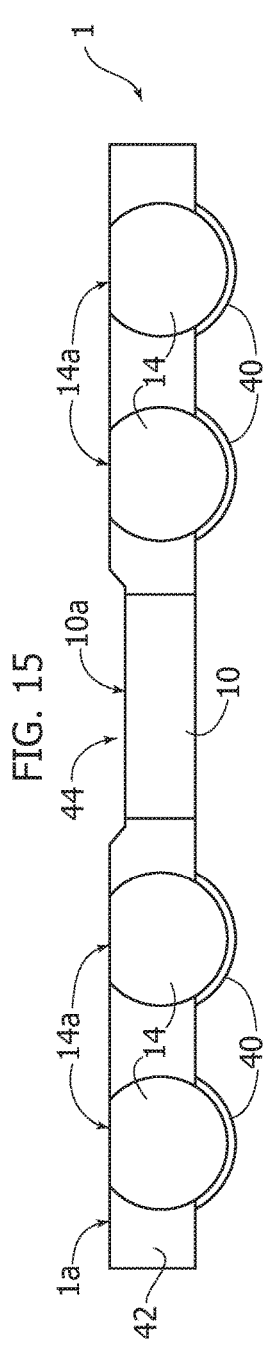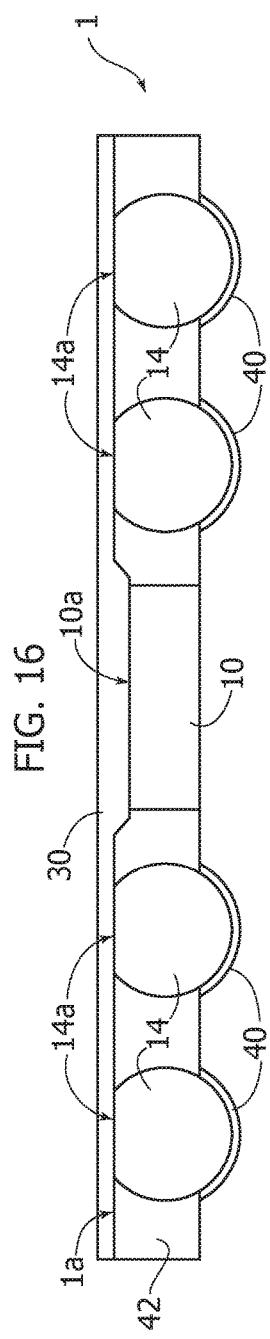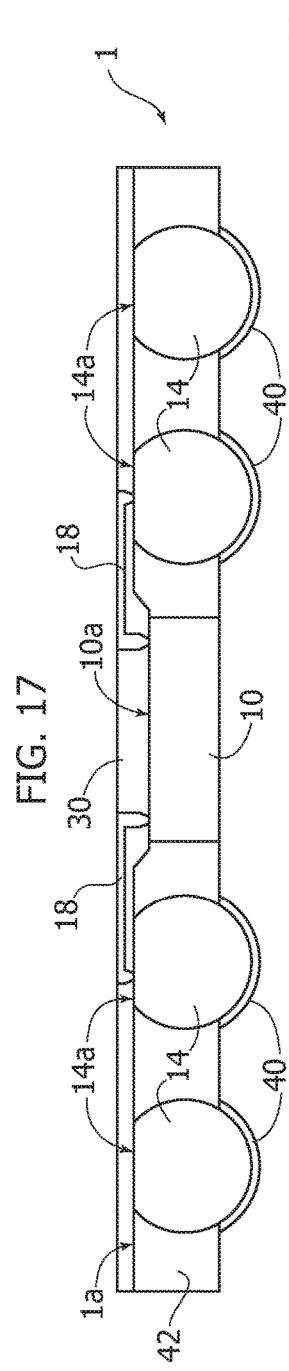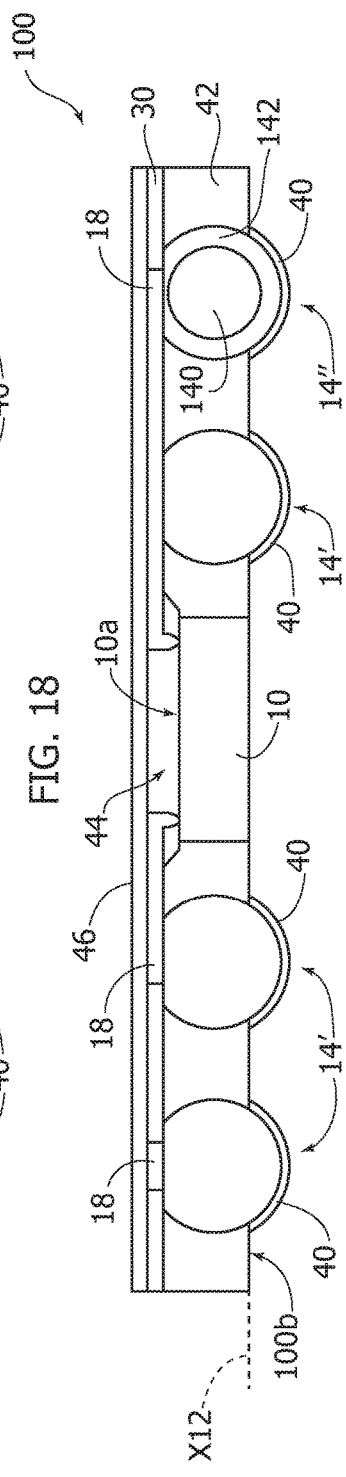

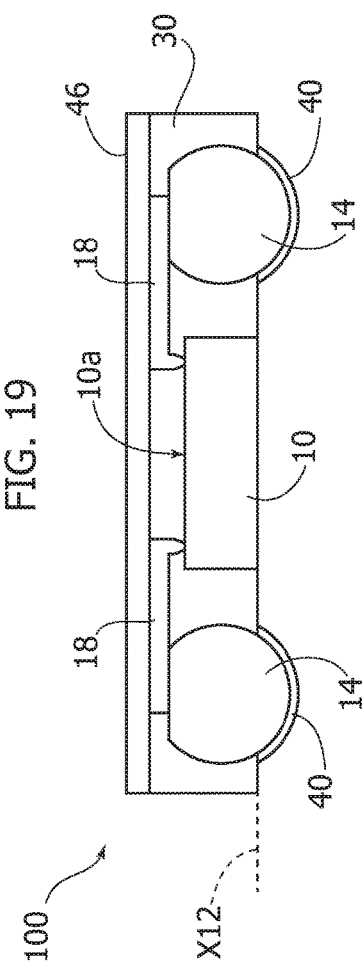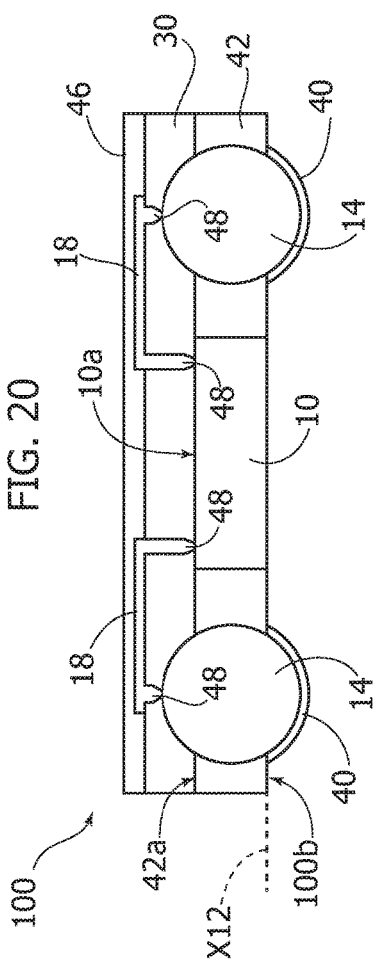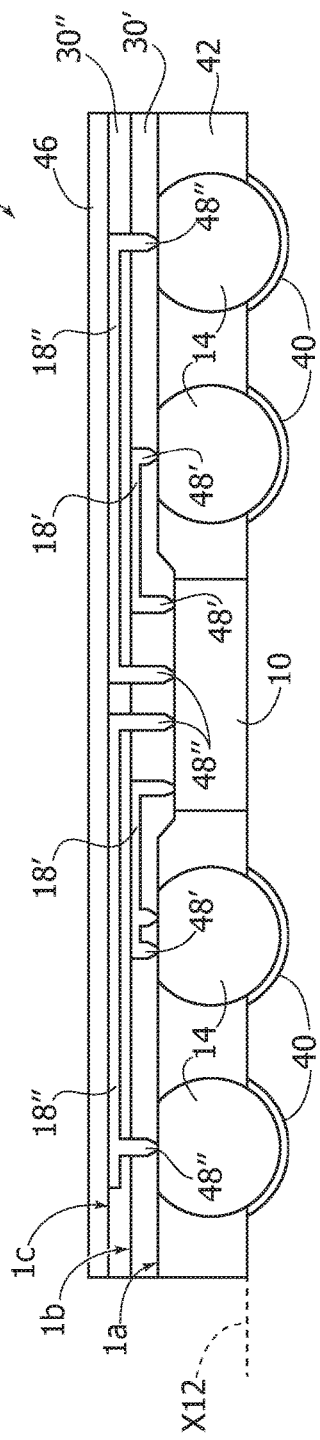

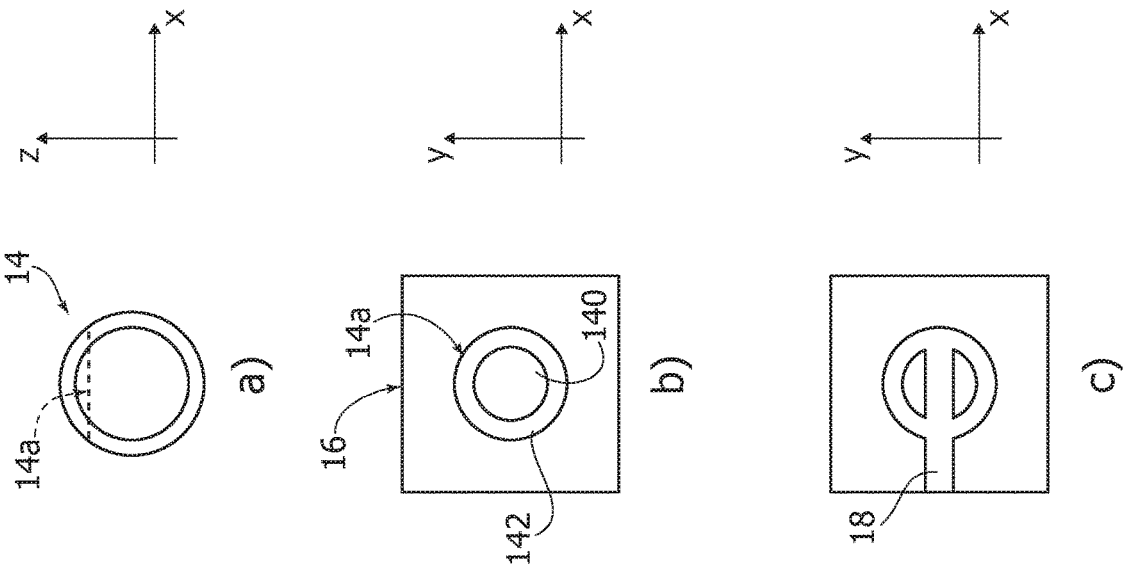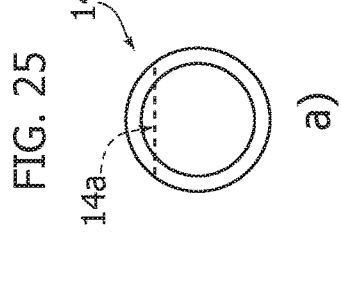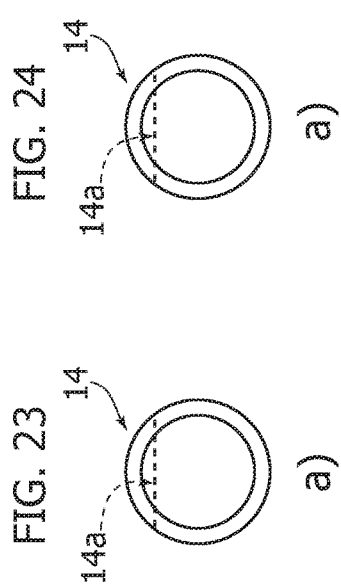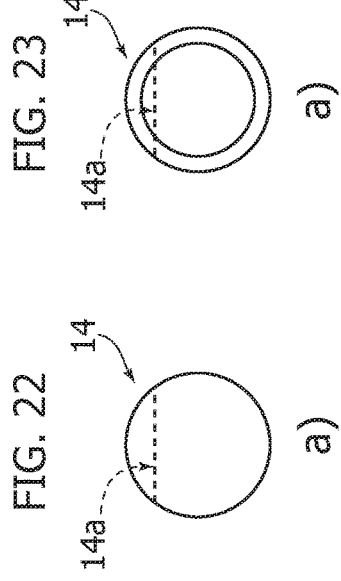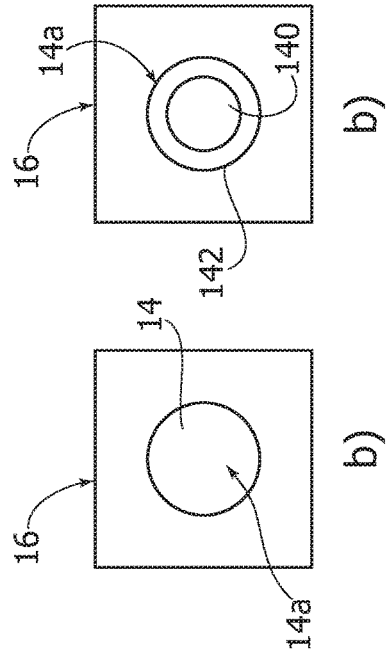

METHOD OF MANUFACTURING SEMICONDUCTOR DEVICES AND CORRESPONDING SEMICONDUCTOR DEVICE

BACKGROUND

Technical Field

The description relates to manufacturing semiconductor devices, such as integrated circuits (ICs).

One or more embodiments may be applied to semiconductor packages, e.g., of QFN (Quad-Flat No-Lead) type.

Description of the Related Art

Semiconductor packaging, e.g., for QFN packages, may be performed according to a number of different manufacturing methods.

For example, a semiconductor die may be attached to a leadframe and wire bonding may be used to connect contact pads of the semiconductor die to the leads of the leadframe.

Also for example, it may be possible to use a flip chip method, namely placing a semiconductor die on a leadframe, with the contact pads being on the surface of the semiconductor die that comes into contact with a surface of the leadframe. The connection to the leads of the leadframe may be obtained via solder bumps that have been deposited onto the die contact pads.

Known package manufacturing techniques may comprise a number of disadvantages, and improved solutions are thus desirable.

BRIEF SUMMARY

One or more embodiments are directed to a method of forming a semiconductor device. One or more embodiments may comprise a corresponding semiconductor device (e.g., a QFN power package).

One or more embodiments may achieve one or more of the following:
- assembling packages, e.g., power packages, in the absence of wire bonding step(s),
- assembling packages in the absence of a leadframe,
- improving fan-out characteristics,
- providing a package having a semiconductor die embedded therein,
- providing thick metal (e.g., copper) plating on a laser direct structuring LDS routing,
- reducing the thickness of the packages,
- the package or semiconductor device may be used for high power application, and/or
- routing may be done, upon request, by lasering.

BRIEF DESCRIPTION OF SEVERAL VIEWS OF THE DRAWINGS

One or more embodiments will now be described, by way of example only, with reference to the annexed figures, wherein:

FIGS. 1 to 8 are exemplary of steps of a method according to one or more embodiments, FIGS. 9 and 10, portions a) and b), are exemplary of features related to laser direct structuring technology, FIGS. 11 to 17 are exemplary of steps of a method according to one or more embodiments, FIGS. 18 to 21 represent cross-sectional views of semiconductor devices that may be manufactured with the method according to one or more embodiments, and FIGS. 22 to 25, portions a) to c), are exemplary of possible features comprised in one or more embodiments.

By way of general remark, one may note that details and features herein discussed, singly or in combination, in connection with any one of the figures are not necessarily limited to use in embodiments as exemplified in that figure; such details and features may in fact be applied, singly or in combination, in embodiments as exemplified in any other of the figures annexed herein.

DETAILED DESCRIPTION

In the ensuing description, one or more specific details are illustrated, aimed at providing an in-depth understanding of examples of embodiments of this description. The embodiments may be obtained without one or more of the specific details, or with other methods, components, materials, etc. In other cases, known structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment" or "in one embodiment" that may be present in one or more points of the present description do not necessarily refer to one and the same embodiment. Moreover, particular conformations, structures, or characteristics may be combined in any adequate way in one or more embodiments.

The references used herein are provided merely for convenience and hence do not define the extent of protection or the scope of the embodiments.

One or more embodiments may improve over certain previous developments, e.g., MicroLeadFrame® MLF packages, for example rtMLF® (routable molded leadframe), as available with Amkor Technology, are exemplary of conventional solution.

Figure 1:
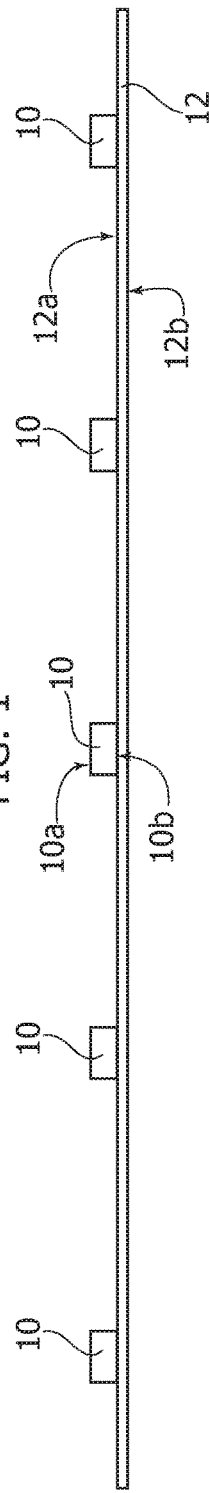

In one or more embodiments as exemplified in FIG. 1, for manufacturing a semiconductor device, one or more semiconductor dies 10 may be arranged on a temporary laminar support member 12, e.g., a temporary polyamide tape. The semiconductor dies 10 may be arranged on respective mounting locations onto a front surface 12a of the support member 12, with the mounting locations being arranged sidewise with respect to one another, optionally arranged in a row or in a matrix arrangement.

Accordingly, the semiconductor dies 10 may be arranged having a back surface 10b facing the front surface 12a of the support member 12, and a front surface 10a, opposite to the back surface 10b, that may comprise one or more die pads. The front face 12a of the semiconductor dies 10 includes an active surface that includes integrated circuits.

In one or more embodiments, the support member 12 may comprise an adhesive tape having an adhesive front surface 12a, and the semiconductor dies 10 may be adhesively attached thereon. Alternatively, the support member 12 may comprise a UV curable layer of glue, that may act as a temporary substrate.

The following description of one or more embodiments will refer to the manufacturing of a single semiconductor device for brevity and for the sake of understanding. However, even if described with respect to a single semiconductor device, the method may be extended to the manufacturing process of an array of packages, by adding a singulation step at the end of the method according to one or more embodiments.

In one or more embodiments, a plurality of recesses 13 may be formed in the support member 12. As exemplified in FIG. 2, a support structure 32 (e.g., a mold element of a molding tool) may comprise a plurality of recesses on a front surface and the support member 12 may be laid on the front surface. The plurality of recesses of the support structure 32 may receive the back surface 12b of the support member 12, and the plurality of recesses 13 may be formed in the support member 12.

In one or more embodiments, vacuum may be applied to facilitate retaining the support member 12 on the front surface of the support structure 32. For example, the back surface 12b of the support member 12 may be maintained adherent to the front surface of the support structure 32 via vacuum applied through openings 34 of the support structure 32.

Figure 3:
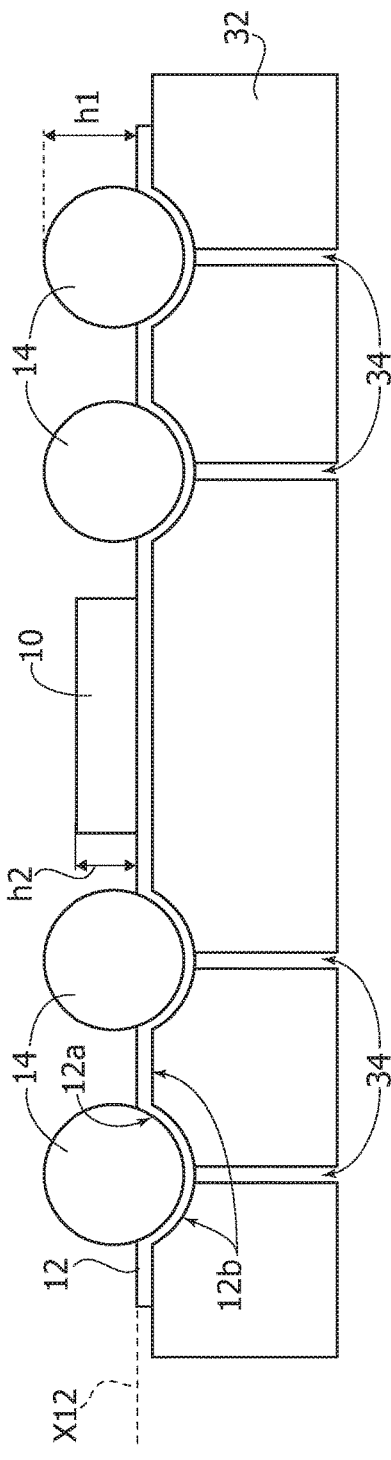

In one or more embodiments, the plurality of recesses 13 may have dimensions suitable for receiving a plurality of spheres 14, as exemplified in FIG. 3. The spheres 14 are made of a conductive material. The spheres 14 may be dropped, i.e., placed, in corresponding recesses 13 with a stencil, with the front surface 12a of the support member 12 that may facilitate maintaining the spheres 14 in the recesses 13, e.g., via adhesive attachment if the support member 12 comprises an adhesive front surface 12a. It will be appreciated that:
  the semiconductor die 10 may lie on a plane X12, exemplified with a dashed line in FIG. 3,
  the dimensions of the recesses 13 may be so that the spheres 14 may lie at least partially below the plane X12, i.e., in the present exemplary arrangement, portions of the spheres 14 may lie below the back surface 10b of the semiconductor die 10, and/or
  the spheres 14 may have thickness so that, when received within the recesses 13, the spheres 14 may have a height h1 with respect to the plane X12 that exceeds a height h2 of the semiconductor die 10 with respect to the plane X12.

In one or more embodiments, the plurality of spheres 14 may be arranged sidewise with respect to one another, and/or surrounding the semiconductor dies 10.

Figure 2:
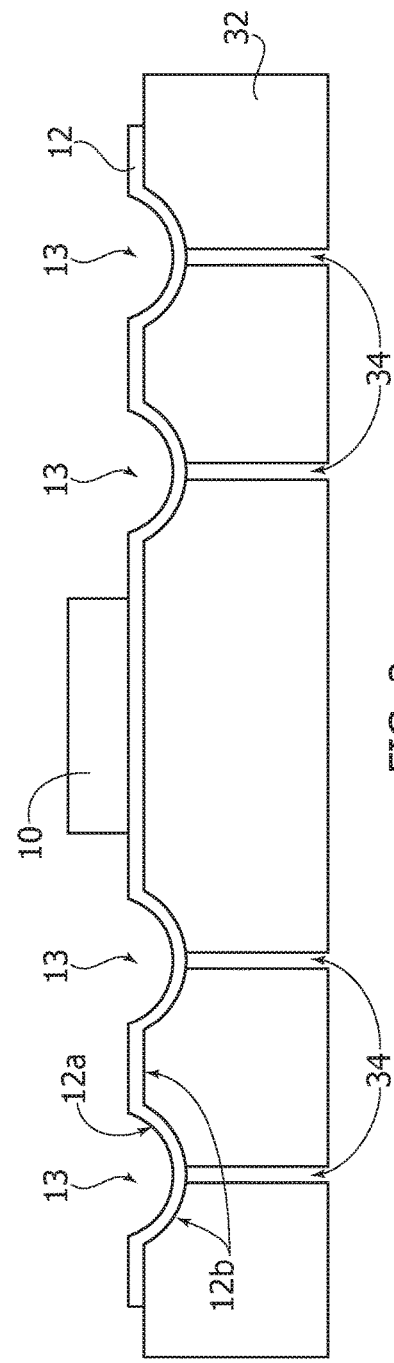

In the following description of FIGS. 4 to 25, parts or elements like part or elements already introduced in connection with FIGS. 1 to 3 are indicated with like reference symbols, without repeating the related description for the sake of brevity.

In one or more embodiments as exemplified in the cross-sectional views of FIGS. 4 to 6, the spheres 14 may be arranged on the temporary laminar support member 12 in a substantially concurrent step with respect to the arrangement in a row of the semiconductor dies 10. For example, the spheres 14 may be arranged on the laminar support member 12 sidewise with respect to one another and surrounding the semiconductor dies 10. Again, if the support member 12 is an adhesive tape, the spheres 14 and the back surfaces 10b of the semiconductor dies 10 may be attached thereto at respective mounting locations.

In one or more embodiments, rigid frames (boats) 36 may be provided, having reference holes for molding. For example, the support member 12 may be held with a rigid ring.

In one or more embodiments, with reference to FIG. 5, the support member 12, having the spheres 14 and semiconductor dies 10 attached thereon (for simplicity, only one semiconductor die 10 is visible), may be laid on the support structure 32 (e.g., a molding element of a molding tool), with the spheres 14 arranged over the plurality of recesses of the support structure 32. Again, vacuum may be applied via the openings 34, and the spheres 14 may thus form the plurality of recesses 13 of the support member 12.

In one or more embodiments, the spheres 14 may be maintained in position in the recesses 13 of the support member 12, due to the adhesive front surface 12a thereof, if present.

In one or more embodiments, molding material may be applied to the spheres 14 and the semiconductor die 10, the molding material surrounding and optionally embedding the spheres 14 and the semiconductor die 10.

For example, in one or more embodiments, as exemplified in FIG. 7, a molding tool may be used for applying molding material to the spheres 14 and the semiconductor die 10. In the non-limiting example of FIG. 7, the support structure 32 may comprise a first mold part, which in the illustrated embodiment is formed by the support structure 32 but may also be a separate component in other embodiments, and a second mold part 38, with the first and second mold parts 32, 38 jointly defining a molding cavity C; this is merely an example of molding tool, and may vary depending on specific designs of the complementary mold parts. For instance, in one or more embodiments, the first and second mold part may comprise plural mold elements.

In one or more embodiments, the arrangement of either FIG. 3 or 6 may be enclosed in the molding cavity C, with the second molding part 38 placed over the spheres 14 and the semiconductor die 10: optionally, the spheres 14 may be clamped in the molding cavity C, i.e., in one or more embodiments, the cavity C may have a height, with respect to the plane X12, higher or equal to the height h1 of the spheres 14.

FIG. 8 represents a molding step, wherein transfer molding or sheet molding may be performed, e.g., a mold layer such as the one available with by Shin-Etsu.

Therefore, a mold layer may be formed of molding material, e.g., laser direct structuring material LDS 30, that may surround and embed the spheres 14 and semiconductor die 10. An assembly 1, comprising the LDS layer 30, the spheres 14 and the semiconductor die 10 may be extracted from the molding cavity C, and the temporary support member 12 may be discarded, at least at the spheres 14.

Figure 9:
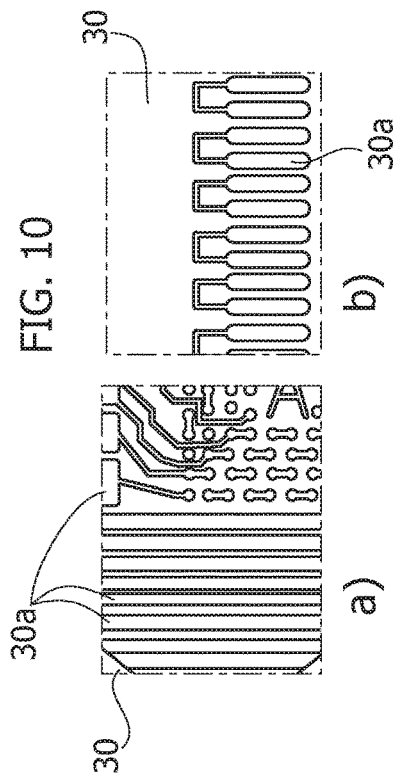

By way of background, FIG. 9 is exemplary of laser direct structuring LDS technology, that may be used to provide a routing level in one or more embodiments.

A modified polymer 30 may be provided, comprising a metallorganic complex additive in a polymer matrix, the metallorganic complex (e.g., comprising Nitrogen, a metal element and Oxygen) being laser-activatable. In one or more embodiments, the modified polymer 30 may comprise a LDS material, e.g., a thermoset epoxy compound.

Laser light L radiation may be applied on the modified polymer 30, and portions 30a of the modified polymer 30, whereon the laser light L passes, may become conductive, insofar as the metallorganic complex additive comprised in the modified polymer 30 may be activated by laser ablation.

Figure 10:
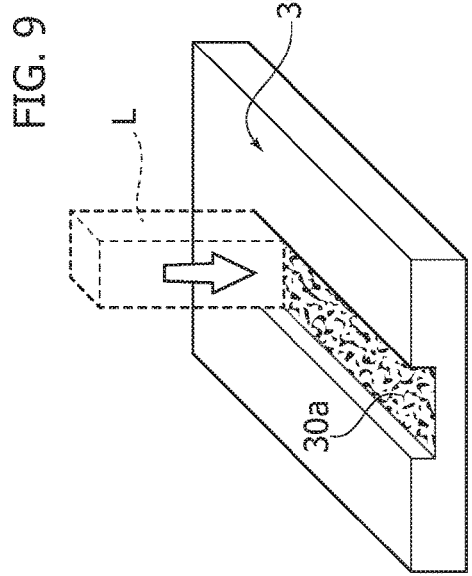

FIG. 10, portions a) and b) exemplify metallized LDS polymer material: in one or more embodiments, the portions 30a of the LDS material 30 may be metallized and used for routing, e.g., as electrically-conductive traces.

Figure 11:
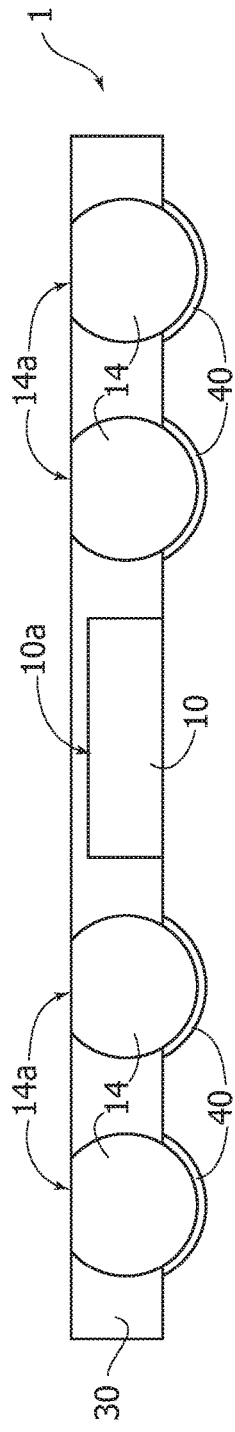

FIG. 11 represents a cross-sectional view of the assembly 1 after a grinding step: the LDS layer 30 may be thinner after grinding, and leveled or flattened surfaces 14a of the spheres 14 may be formed.

Laser light may be applied to the assembly 1, thereby:
forming vias in the LDS layer 30 at die pads (not visible in the figures) present on the front surface 10a of the semiconductor die 10, and
forming a routing pattern between selected ones of the spheres 14 and selected ones of the die pads of the semiconductor die 10.

Figure 12:
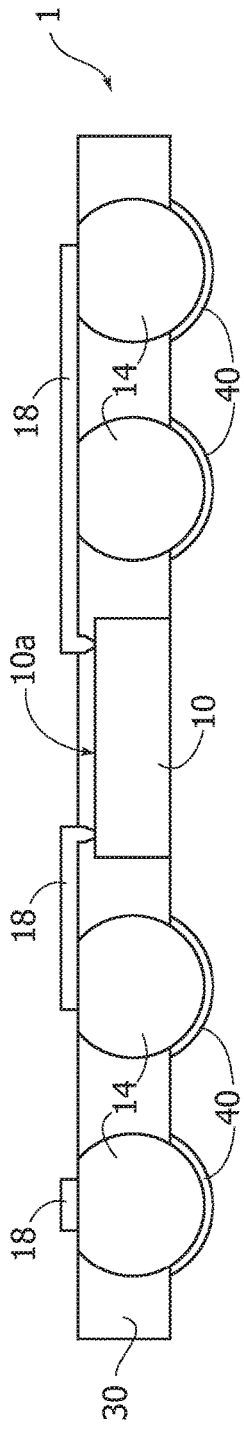

FIG. 12 exemplifies the assembly 1 after a laser exposure step and a plating step is performed: electrically-conductive material may be applied in the routing pattern written by the laser light, that may form plated traces 18. The traces 18 may substantially correspond to the traces 30a exemplified in FIG. 10, portions a) and b).

In the assembly 1 of FIGS. 11 and 12, a tin plating 40 may be performed, whereby portions of the spheres 14 that may be left uncovered due to the removal of the support member 12 may be plated with tin.

FIG. 13 exemplifies the possibility of providing the second mold part 38 with a protrusion 39 that may be in contact with the front surface 10a of the semiconductor die 10 when the second mold part 38 is placed over the spheres 14 and semiconductor die 10, clamps the spheres 14 and the molding cavity C is formed.

FIG. 14 represents a (e.g., transfer) molding step, wherein a mold layer 42, e.g., of STD standard epoxy, may be applied, that may embed the spheres 14 and surround the semiconductor die 10, as exemplified herein: the epoxy molding therefore may be performed exposing the front surface 10a of the semiconductor die 10.

FIG. 15 represents a cross-sectional view of the assembly 1 that may be extracted from the molding cavity, after a grinding step. A recess 44 in a ground surface 1a may be present, due to the protrusion 39, with the front surface 10a of the semiconductor die 10 being exposed therein. Also, the leveled or flattened surfaces 14a of the spheres 14 may be present at the ground surface 1a.

A LDS layer 30 may be applied on the ground surface 1a, that may cover the leveled surfaces 14a of the spheres 14 and fill the recess 44 (thereby covering the front surface 10a of the semiconductor die 10), as exemplified in FIG. 16. If the compound used comprises LDS material 30, vias and traces can be lasered and plated, and a layer of LDS material 30 may be applied on top of the mold before grinding or after grinding.

Again, with reference to FIG. 17, laser light may be applied to the LDS layer 30 and:
vias may be formed in the LDS layer 30 at leveled surfaces 14a of the spheres 14 and at die pads (not visible) on the front surface 10a of the semiconductor die 10,
routes may be formed between selected ones of the spheres 14 and selected ones of the die pads of the semiconductor die 10, and
electrically-conductive material may be applied to the routes and vias written by the laser.

Electrically-conductive plated traces 18 may thus be present within the LDS layer 30, that may be similar to the metallized portions 30a of FIG. 10, portions a) and b).

Also in the assembly 1 of FIGS. 15 to 17, the tin plating 40 may be present.

FIGS. 18 to 21 represent cross-sectional views of semiconductor devices 100 that may be obtained with the method according to one or more embodiments. The semiconductor die 10 and the (e.g., ground and flattened) spheres 14 may be surrounded by molding material 42, e.g., STD epoxy material, that may be applied so that the front surface 10a of the semiconductor die 10 may be exposed. The back surface 10b of the semiconductor die 10 may lie in the plane X12. Also a back surface 100b of the semiconductor device 100 may lie in the plane X12, with portions of the spheres 14 protruding therefrom.

In FIG. 18, the semiconductor die 10, which may include a silicon die, may be connected, at the die pads (not visible) thereof, via thick plated traces 18, to selected ones of the spheres 14, that may or may not be visible in the cross-sectional view of FIG. 18. The traces may be formed within the LDS material 30 and may have a thickness corresponding to a thickness of the LDS material 30 in portions of the LDS material away from the recess 44.

A further molding material 46, e.g., a polymeric resist, may be applied over the plated traces 18 and the LDS material 30, to cover and protect the semiconductor device 100. In one or more embodiments, as exemplified in FIG. 18, the spheres 14 may be full, e.g., copper spheres 14', or may comprise spheres 14" that may include a polymeric material core 140 coated with electrically-conductive material 142. The spheres 14', 14" may be coated with tin 40 at portions extruding from the back surface 100b of the semiconductor device 100.

FIG. 19 represents a possible semiconductor device 100, similar to the semiconductor device 100 of FIG. 18, wherein also the molding material surrounding the semiconductor die 10 and ground spheres 14 may comprise LDS material 30. Accordingly, in one or more embodiments, the molding material may consist of LDS material 30, and the semiconductor die 10 and spheres 14 may be surrounded and embedded in the LDS material 30. An overmolding material may be provided on the LDS layer 30, after routing, to protect the semiconductor device 100, with the overmolding material comprising polymeric resist 46.

In one or more embodiments, as exemplified in FIG. 20, a grinding step may be absent, i.e., the leveled surfaces 14a of the spheres 14 may be absent. For example, the grinding step may be absent if diameters of the spheres 14 are smaller than double a thickness of the semiconductor die 10.

The molding material, e.g., epoxy material 42, may surround the spheres 14 and the semiconductor die 10, with the epoxy material 42 having a thickness corresponding to the thickness of the semiconductor die. In particular, front and back portions of the spheres 14 may protrude in either direction from the molding material 42. On the back surface 100b of the semiconductor device 100, the back protruding portions of the spheres 14 may be coated with tin 40. Conversely, LDS material 30 may be applied on a front surface 42a of the molding material 42: the LDS material 30 may cover the front protruding portions of the spheres 14 and the front surface 10a of the semiconductor device 100.

In one or more embodiments, vias 48 may be formed, by laser, in the LDS material 30, at the die pads of the semiconductor die 10 and at the protruding front portions of the spheres 14. The vias 48 may be filled with electrically-conductive material.

In one or more embodiments, thick plated traces 18 may be formed, on the LDS material 30, between selected ones of the vias 48 at the protruding front portions of the spheres 14 and selected ones of the vias 48 at the die pads of the semiconductor die 10.

In one or more embodiments, as exemplified in FIG. 21, multiple layers of LDS material 30 may be provided, e.g., a first layer 30' and a second layer 30". Also, the molding material surrounding the semiconductor die 10 and the ground spheres 14 may comprise LDS material 30, or, as exemplified herein, STD epoxy material 42.

For example, the first layer 30' may be applied on the ground surface 1a, and first vias 48' and first plated traces 18' may be formed within the first layer of LDS material 30', as previously discussed, that may connect a first set of spheres 14 and die pads.

The second layer of LDS material 30" may be applied on a surface 1b of the first layer of LDS material 30', thereby covering the first layer of LDS material 30' and the first plated traces 18'. Similarly, second vias 48" may be formed, that may pass through the first and second layer of LDS material 30' and 30", towards a second set of spheres 14 and die pads. Second plated traces 18" may be formed within the second layer of LDS material 30", that may connect the die pads and the spheres 14 of the second set of spheres and die pads.

Again, the polymeric resist 46 coating may be applied, on a surface 1c of the second layer of LDS material 30", thereby covering the second layer of LDS material 30" and the second plated traces 18", and protecting the semiconductor device 100.

FIG. 21 is also exemplary of the possibility, in one or more embodiments to provide plural or multiple vias 48', 48" coupling to a "common" sphere 14. Such an arrangement may facilitate and increased current flow, e.g., in power devices.

One or more embodiments may thus relate to the possibility of realizing a thin package in the absence of a leadframe, by using electrically-conductive (e.g., copper) bodies (e.g., spheres) or electrically-conductive bodies having a core of polymeric material plated with electrically-conductive material, e.g., copper. Hereinafter, the electrically-conductive bodies will be exemplified and referred to as spheres, for the sake of brevity and understanding, however the spherical shape is merely a non-limiting example of possible shapes that may be used for the electrically-conductive bodies.

In one or more embodiments, the spheres may act as connections or pads for the package, after plating and connection steps are performed with die pads of a semiconductor die comprised in the package. Accordingly, plated traces may be provided, connecting the die pads and the spheres, e.g., formed on laser direct structuring LDS molding compound.

In one or more embodiments, a connection with an electrically-conductive surface of the spheres may be done on the molding compound, after a plating step may be performed on a path defined by laser writing.

FIGS. 22 to 25 exemplify possible features of electrically-conductive bodies 14 according to one or more embodiments, wherein:

FIG. 22 exemplifies a full sphere 14 made of copper alloy,

FIG. 23 exemplifies a metallic core 140 coated with electrically-conductive material 142, e.g., copper, FIG. 24 exemplifies a polymeric, e.g., PTFE, polytetrafluoroethylene—core 140 coated with electrically-conductive material 142, FIG. 25 exemplifies a polymeric, e.g., a laser direct structuring LDS material, core 140 coated with an electrically-conductive material 142, and wherein:

portions a) exemplify cross-sectional views of the spheres 14, portions b) exemplify top views of the spheres 14 after grinding steps are performed thereon, and portions c) exemplify top views of the spheres 14 after trace plating steps are performed.

In one or more embodiments, as exemplified in portions b) of FIGS. 22 to 25, the spheres 14 may be embedded (not visible in the figures) and/or surrounded by molding material 16, and a grinding step may be performed on a surface of the molding material in order to expose the spheres 14, and optionally form leveled front surfaces 14a of the spheres 14.

For example, considering an x-y-z Cartesian system as exemplified in FIGS. 22 to 25, a grinding step may be performed in a vertical direction, i.e., in a direction aligned to a z axis: for example, the grinding step may be discontinued when the leveled surfaces 14a of the spheres 14 may be formed, in the present-non limiting example the leveled surfaces 14a, that be exposed after grinding, may exemplified as dashed lines in portions a) of FIGS. 22 to 25.

Accordingly, in the top views of portions b) of FIGS. 22 to 25, the leveled front surfaces 14a may be visible, and the cores 140 of the spheres 14—if present—may be exposed.

In one or more embodiments, trace plating steps may be performed after the spheres 14 are ground, as exemplified in portions c) of FIGS. 22 to 25, wherein:

a trace 18 may extend to a peripheral portion of the sphere 14, as exemplified in FIG. 22 portion c), a trace 18 may extend to cover the entire leveled surface 14a of the sphere 14, as exemplified in FIG. 23 portion c), a trace 18 may extend to a peripheral portion of the sphere 14, leaving exposed the core 140, as exemplified in FIG. 24 portion c), and a linear trace 18 may extend across the sphere 14 reaching two opposite ends of the coated portion 142 thereof, as exemplified in FIG. 25 portion c).

It will be appreciated that a geometry of the traces 18 may be plated on laser direct structuring material by laser shaping.

In one or more embodiments, a sphere thickness may be comprised in a range of 100 μm to 500 μm (1 μm=$10^{-6}$ m), which may be related to a package body thickness and a semiconductor die thickness. In one or more embodiments, if the spheres 14 are coated with electrically-conductive material 142, e.g., copper plated polymer spheres, the electrically-conductive coating thickness may be defined in order to maintain unexposed the core 140 after grinding, depending of a shape that may be desired for connection with the spheres 14, as exemplified by the different trace profiles exemplified in portions c) of FIGS. 22 to 25.

One or more embodiments may thus relate to a method that may comprise:

providing a laminar support member (e.g., 12), having a front surface (e.g., 12a) and a back surface (e.g., 12b) with at least one semiconductor die mounting location lying in a plane (e.g., X12) at the front surface of the support member, arranging at the at least one semiconductor die mounting location lying in the plane at least one semiconductor die (e.g., 10) having a front surface (e.g., 10a) and a back surface (e.g., 10b) with the back surface of the at least one semiconductor die towards the front surface of the support member, the at least one semiconductor die having die pads at the front surface thereof, arranging at the front surface of the support member sidewise of the at least one semiconductor die mounting location a plurality of electrically-conductive bodies (e.g., 14), the electrically-conductive bodies arranged at respective recesses (e.g., 13) in the support member, the respective recesses opening at the front surface of the support member, providing a filling of molding material (e.g., 30, 42, 46) over the laminar support member between the at least one semiconductor die and the electrically-conductive bodies, and providing electrically-conductive lines (e.g., 18) between selected ones of the die pads of the semiconductor die and selected ones of the plurality of electrically-conductive bodies.

One or more embodiments may comprise:

forming respective recesses in the laminar support member and arranging the electrically-conductive bodies into the recesses formed in the laminar support member; or arranging the electrically-conductive bodies at the front surface of the support member and causing the electrically-conductive bodies to advance into the support member with respective recesses provided therein.

One or more embodiments may comprise forming the respective recesses in the laminar support member by vacuum forming thereof.

One or more embodiments may comprise:

providing the electrically-conductive lines extending over the filling of molding material between the at least one semiconductor die and the electrically-conductive bodies, and providing at least one further filling of molding material (e.g., 30, 42, 46) covering the electrically-conductive lines, the front surface of the at least one semiconductor die and the electrically-conductive bodies.

One or more embodiments may comprise:

dispensing the filling of molding material over the laminar support member by covering the at least one semiconductor die and the electrically-conductive bodies, providing electrically contact surfaces for the electrically-conductive lines at said selected ones of the die pads of the semiconductor die and selected ones of the plurality of electrically-conductive bodies by:

selectively removing the molding material at the selected ones of the die pads of the semiconductor die and/or selected ones of the plurality of electrically-conductive bodies, and/or including laser direct structuring material (e.g., 30) in the molding material at said selected ones of the die pads of the semiconductor die and/or selected ones of the plurality of electrically-conductive bodies and laser activating (e.g., L) the laser direct structuring material at said selected ones of the die pads of the semiconductor die and/or selected ones of the plurality of electrically-conductive bodies.

In one or more embodiments, selectively removing the molding material may comprise:

drilling passageways (e.g., 48) through the molding material, and/or grinding the molding material.

One or more embodiments may comprise filling with electrically-conductive material the passageways drilled through the molding material.

In one or more embodiments, the electrically-conductive bodies may comprise an electrically-insulating core (e.g., 140) coated with electrically-conductive material (e.g., 142).

One or more embodiments may comprise adhesively applying the at the at least one semiconductor die and the electrically-conductive bodies at the front surface of the laminar support member.

One or more embodiments may comprise providing the laminar support member as a tape having a plurality of semiconductor die mounting location therealong.

One or more embodiments may comprise, after providing the filling of molding material, removing the laminar support member at least at the electrically-conductive bodies.

One or more embodiments may relate to a semiconductor device (e.g., 100), comprising:

at least one semiconductor die (e.g., 10), the at least one semiconductor die having a front surface (e.g., 10*a*) and a back surface (e.g., 10*b*) lying in plane (e.g., X12), the at least one semiconductor die having die pads at the front surface thereof, a plurality of electrically-conductive bodies (e.g., 14), the electrically-conductive bodies arranged sidewise of the at least one semiconductor die and protruding from the plane away from the back surface of the at least one semiconductor die, opposite the at least one semiconductor die, a filling of molding material (e.g., 30, 42, 46) between the at least one semiconductor die and the electrically-conductive bodies, and electrically-conductive lines (e.g., 18) between selected ones of the die pads of the semiconductor die and selected ones of the plurality of electrically-conductive bodies, the semiconductor device obtainable with the method according to one or more embodiments.

Without prejudice to the underlying principles, the details and embodiments may vary, even significantly, with respect to what has been disclosed by way of example only, without departing from the extent of protection.

In that respect, one may again note that details and features herein discussed, singly or in combination, in connection with any one of the figures are not necessarily limited to use in embodiments as exemplified in that figure; such details and features may in fact be applied, singly or in combination, in embodiments as exemplified in any other of the figures annexed herein.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method, comprising:

coupling a back surface of a semiconductor die to a support member, the semiconductor die having a front surface having a plurality of die pads;

forming a plurality of recesses in the support member by applying a vacuum to the support member;

arranging a plurality of electrically-conductive bodies into the plurality of recesses, respectively, formed in the support member, wherein the plurality of electrically- conductive bodies are laterally arranged with respect to the semiconductor die;

molding a molding material over the support member between the semiconductor die and the plurality of electrically-conductive bodies, and forming a plurality of electrically-conductive lines on the molding material, the plurality of electrically-conductive lines extending between respective ones of the plurality of die pads of the semiconductor die and respective ones of the plurality of electrically-conductive bodies.

2. The method of claim 1, comprising forming a subsequent molding material over the plurality of electrically-conductive lines, the front surface of the semiconductor die and the plurality of electrically-conductive bodies.

3. The method of claim 1, comprising forming contact surfaces for the plurality of electrically-conductive lines at the respective ones of the plurality of die pads of the semiconductor die and respective ones of the plurality of electrically-conductive bodies by:
including laser direct structuring material in the molding material, and
laser activating the laser direct structuring material at the respective ones of the plurality of die pads of the semiconductor die and the respective ones of the plurality of electrically-conductive bodies.

4. The method of claim 3, wherein prior to forming the contact surfaces the method comprises grinding the molding material.

5. The method of claim 1, comprising, after molding the molding material, removing the support member from at least the plurality of electrically-conductive bodies.

6. A method, comprising:
coupling a back surface of a semiconductor die to a support member, the semiconductor die having a front surface having a plurality of die pads;
arranging a plurality of electrically-conductive bodies to the support member at locations that are laterally arranged with respect to the semiconductor die, wherein each of the plurality of electrically-conductive bodies comprises an electrically-insulating core coated with electrically-conductive material;
molding a molding material over the support member between the semiconductor die and the plurality of electrically-conductive bodies, and
forming a plurality of electrically-conductive lines on the molding material, the plurality of electrically-conductive lines extending between respective ones of the plurality of die pads of the semiconductor die and respective ones of the plurality of electrically-conductive bodies.

7. The method of claim 6, wherein forming the plurality of electrically-conductive lines on the molding material includes:
forming passageways through the molding material, and
filling the passageways with electrically-conductive material.

8. The method of claim 6, wherein prior to arranging the plurality of electrically-conductive bodies to the support member, the method comprises coupling the support member to a support structure and forming a plurality of recesses in the support member, wherein arranging the plurality of electrically-conductive bodies to the support member includes causing the plurality of electrically-conductive bodies to advance into the plurality of recesses, respectively.

9. A method, comprising:
coupling a back surface of a semiconductor die to a support member, the semiconductor die having a front surface having a plurality of die pads;
arranging a plurality of electrically-conductive bodies to the support member at locations that are laterally arranged with respect to the semiconductor die;
molding a molding material over the support member between the semiconductor die and the plurality of electrically-conductive bodies, and forming a plurality of electrically-conductive lines on the molding material, the plurality of electrically-conductive lines extending between respective ones of the plurality of die pads of the semiconductor die and respective ones of the plurality of electrically-conductive bodies,
wherein coupling the back surface of the semiconductor die to the support member comprises using adhesive to couple the semiconductor die to the support member, wherein arranging the plurality of electrically-conductive bodies to the support member comprises using adhesive to couple the plurality of electrically-conductive bodies to the support member.

10. The method of claim 9, wherein the support member is tape.

11. A semiconductor device, comprising:
a semiconductor die having a front surface and a planar back surface, the semiconductor die having a plurality of die pads at the front surface;
a plurality of electrically-conductive bodies arranged laterally with respect to the semiconductor die, wherein the plurality of electrically-conductive bodies are at least partially sphere shaped;
a molding material between the semiconductor die and the plurality of electrically-conductive bodies, wherein convex portions of the plurality of electrically-conductive bodies protrude beyond a back surface of the molding material; and
a plurality of electrically-conductive lines extending between respective ones of the plurality of die pads of the semiconductor die and respective ones of the plurality of electrically-conductive bodies.

12. The semiconductor device of claim 11, wherein the plurality of electrically-conductive bodies extend through an entire thickness of the molding material.

13. The semiconductor device of claim 11, further comprising a metal layer on the convex portions of the plurality of electrically-conductive bodies protruding beyond the molding material.

14. The semiconductor device of claim 13, wherein the metal layer on the convex portions of the plurality of electrically-conductive bodies abuts a surface of the molding material.

15. A semiconductor device, comprising:
a semiconductor die having a front surface and a back surface, the front surface being an active surface having a bond pad;
an electrically-conductive body arranged laterally with respect to the semiconductor die, the electrically-conductive body being substantially sphere shaped; and
an LDS molding material over the front surface of the semiconductor die and between the semiconductor die and the electrically-conductive body, the electrically-conductive body having a portion protruding beyond a back surface of the LDS molding material.

16. The semiconductor device of claim 15, comprising an electrically-conductive line on the LDS molding material coupling a die pad of the semiconductor die to the electrically-conductive body, wherein the electrically-conductive body has a first surface and a second surface, wherein the first surface is coupled to the electrically-conductive line, wherein the second surface is formed by the portion and extends beyond a plane formed by the back surface of the semiconductor die.

17. The semiconductor device of claim 16, wherein the first surface of the electrically-conductive body is flat and coplanar with a front surface of the LDS molding material.

18. The semiconductor device of claim 16, further comprising a metal layer over the second surface of the electrically-conductive body.

19. The semiconductor device of claim 16, further comprising a molding material over the electrically-conductive line, the electrically-conductive body, and the bond pad of the semiconductor die.

* * * * *